United States Patent
Ziller

(10) Patent No.: US 10,510,196 B2
(45) Date of Patent: Dec. 17, 2019

(54) REMOTE KEY FOB FOR MOTOR VEHICLES

(71) Applicant: Boris Ziller, Ratingen (DE)

(72) Inventor: Boris Ziller, Ratingen (DE)

(73) Assignee: Huf Huelsbeck & Duerst GmbH & Co. KG, Velbert (DE)

(*) Notice: Subject to any disclaimer, the term of this patent is extended or adjusted under 35 U.S.C. 154(b) by 0 days.

(21) Appl. No.: 16/116,552

(22) Filed: Aug. 29, 2018

(65) Prior Publication Data
US 2019/0088051 A1 Mar. 21, 2019

(30) Foreign Application Priority Data
Sep. 20, 2017 (DE) .................... 10 2017 121 823

(51) Int. Cl.
G07C 9/00 (2006.01)
G06K 19/07 (2006.01)
G06K 19/077 (2006.01)

(52) U.S. Cl.
CPC ...... *G07C 9/00119* (2013.01); *G06K 19/0716* (2013.01); *G06K 19/0719* (2013.01); *G06K 19/07703* (2013.01); *G06K 19/07728* (2013.01)

(58) Field of Classification Search
CPC ............ G07C 9/00119; G07C 9/00944; G06K 19/0716; G06K 19/0719; G06K 19/07703; G06K 19/07728
See application file for complete search history.

(56) References Cited

U.S. PATENT DOCUMENTS

| 9,359,790 | B2* | 6/2016 | Stetter | B29C 45/561 |
| 2005/0258687 | A1* | 11/2005 | Zapf | A01K 67/0271 307/106 |
| 2008/0142346 | A1* | 6/2008 | Zapf | F16H 59/105 200/61.88 |

(Continued)

FOREIGN PATENT DOCUMENTS

| DE | 10 2012 210 357 A1 | 12/2013 |
| DE | 10 2013 105 195 A1 | 11/2014 |

OTHER PUBLICATIONS

Oberhauser, Chris, "LDC Sensor Design", Texas Instruments, Application Report SNOA930A, Mar. 2015 (Revised Apr. 2018), pp. 1-26.

*Primary Examiner* — Thomas D Alunkal
(74) *Attorney, Agent, or Firm* — Fay Sharpe LLP

(57) ABSTRACT

A remote key fob for a vehicle, includes a communications and control device, at least one transmit/receive device and a microcontroller. At least one control surface is arranged on an outer shell of a housing of the remote key fob and is coupled to the communications and control device. A printed circuit board held in the housing is placed beneath the control surface. The control surface is mechanically coupled to a metal detection section. Pressure actuation of the control surface from the outside results in a deformation or change of position of the detection section. A detection coil is located on the printed circuit board, wherein the detection coil is coupled to the communications and control device for forming an inductive proximity switch. The communications and control device determines an actuation of the control surface as a function of the inductivity or quality of the detection coil.

8 Claims, 1 Drawing Sheet

(56) References Cited

U.S. PATENT DOCUMENTS

| | | | |
|---|---|---|---|
| 2011/0254661 A1* | 10/2011 | Fawcett | G08B 13/1445 340/5.61 |
| 2014/0346020 A1* | 11/2014 | Heine | H01H 9/0235 200/302.2 |
| 2017/0194114 A1* | 7/2017 | Towers | H01H 13/52 |
| 2018/0314362 A1* | 11/2018 | Kim | G06F 1/1643 |

* cited by examiner

REMOTE KEY FOB FOR MOTOR VEHICLES

BACKGROUND

The invention relates to a remote key fob for motor vehicles. Remote key fobs or also wireless remote controls for motor vehicles have a communications and control device that have at least one transmit/receive device and one microcontroller, A housing forms the outer shell of the remote key fob and arranged on the housing or in the housing are one or a plurality of control surfaces that are provided for detecting actuations by a user, To this end, the control surfaces are coupled to the communications and control device for detecting an operation. A printed circuit board is accommodated in the housing and placed beneath the control surface, wherein at least the microcontroller is arranged on this printed circuit board.

Remote key fobs of the aforesaid type normally have press keys or push buttons.

For example, DE 10 2013 105 195 A1 illustrates a vehicle key fob having buttons. A button is moveably borne in a housing between stops and penetrates a cutout in the housing.

An alternative design of a vehicle key is known from DE 10 2012 210 357 A1, for example. Therein a back-lit display for a motor vehicle key is shown. A reduced wall thickness of the housing is provided in the region of the illuminated display symbol.

Mechanical push buttons that are complicated to produce and sometimes have undesired button haptics are provided in remote key fobs of the aforesaid type. This may be due to required actuating mats or actuating membranes or soft components or even soft keypads that, although they may be joined to the housing in a positive or material fit, have haptics and appearances that differ from adjacent housing parts.

Foreign matter, in particular dust and water, may penetrate into the housing through the transition regions between different materials and gaps that may form, and may have a negative effect both on the visual appearance and on the functionality of the remote key fob. In addition, the materials used are frequently susceptible to soiling and undesired noises may occur when the buttons are actuated.

The object of the invention is to provide a remote key fob that has a better visual design and that is improved with respect to production costs and susceptibility to soiling.

BRIEF SUMMARY

This object is attained using a remote key fob having the features of patent claim 1.

The inventive remote key fob of the type cited in the foregoing is characterized in that a control surface is mechanically coupled to a metal detection section such that a pressure actuation of the control surface from the outside results in a deformation or change of position of the detection section. The coupling may be accomplished using an immediate connection, for example a coating of the control surface with metals or metal finishes or using an embodiment of the control surface itself with a metal material. In addition, a mechanical coupling may be provided, for example, positioning a displaceable metal detection section against the inside of the control surface in the housing of the remote key fob.

Embodied on the printed circuit board, that is, in the interior of the housing and beneath the control surface and the detection section, is a detection coil, wherein the detection coil is coupled to the communications and control device for forming an inductive proximity switch. The communications and control device detects a measure for the inductivity or quality of the detection coil and determines an actuation of the control surface by a user as a function of the measure for the inductivity or quality of the detection coil.

The principle of the structure of inductive proximity switches is known. For instance, induction switches are commercially available, wherein the products are normally sold as inductance-to-digital converters (LDC). Such sensors are connected to a coil arrangement that is arranged in the vicinity of a movable, conductive component. In the invention, the metal detection section that is coupled to the control surface assumes the role of the moveable component. With respect to the arrangement of such a sensor and the embodiment of an associated coil, see for example the application reports from pertinent chip manufacturers, for instance Texas Instruments Application Report SNOA930, March 2015, by Chris Oberhauser and entitled, "LDC Sensor Design."

Since inductive sensors detect changes in distance with great sensitivity and in addition are accommodated encapsulated in the housing of the remote key fob, applying a minor amount of force to the control surface is enough to change the position of the detection section, which may be detected via the coil thereunder and a circuit, coupled thereto, of the communications and control device. The communications and control device may have an LDC converter for this purpose; alternatively, a circuit for evaluating the inductivity or quality of the coil may be constructed using individual components.

If the position or distance of the detection section changes with respect to the coil, the inductivity or quality of the coil changes as well. This change signals an actuation of the control surface, which is detected by the communications and control device in the remote key fob. For example, an associated function, such as locking or unlocking a vehicle, may then be triggered via the communications components of the communications and control device.

One advantage of the design of a remote key fob having inductive actuation detection is the option of being able to do without mechanical components in the housing. The inductive sensor may reliably detect deformations that occur when pressure is applied to a region of the housing. In this way, the surface of the key fob may be designed to be uniform and free of gaps, so that dirt and environmental influences cannot penetrate into the key fob. It is therefore a significant advantage that there is a closed surface in the region of the control surface, which is designed with no joints and without any interruption in the material and without cutouts in the housing for push buttons or other display elements. Because of this, the mechanical strength and housing rigidity are increased, and low priced producibility is promoted by using simpler tools. Such a remote key fob is also visually more pleasing, since it is no longer necessary to provide surfaces with disadvantageous unattractive materials due to their mechanical and sealing properties.

It is preferred that the detection coil is printed on the printed circuit board as a spiral conductor.

A printed detection coil is particularly simple to produce and is easy to place on the printed circuit board relative to the other components. It is particularly preferred to use a circular-spiral coil, since the latter is optimal in terms of its detection accuracy for changes in distance with respect to quality and resistance.

In one preferred refinement of the invention, the remote key fob is embodied with a wake-up device that is coupled to the communications and control device. The communications and control device are itself embodied to activate and deactivate the detection coil. When the detection coil is deactivated, detection of operations is not possible. During periods in which no user access is to be expected, an error detection may be excluded by deactivating the detection coil. In addition, it is possible to save energy using deactivation. In accordance with this embodiment, the communications and control device are coupled to the wake-up device such that the detection coil is activated intermittently as a function of a signal from the wake-up device.

The control surfaces with the respective coupled detection sections that are monitored with the detection coil are thus only activated intermittently, specifically as a function of the signals from the wake-up device. For example, for this the remote key fob may have an externally accessible wake-up switch that is to be actuated first, before the inductively monitored control surface with the coupled detection section is functional. Such a wake-up device may be embodied, for example, in the form of a single push button on the key fob; alternatively, for instance, conductive surfaces may be provided on the key fob that come into contact with the skin of a user when the key is grasped and then supply a wake-up impulse.

The wake-up device is preferably provided with a motion sensor that detects changes in position or accelerations of the remote key fob and outputs a signal to the communications and control device as a function thereof.

Such a motion sensor or position sensor may be obtained commercially and is frequently installed in mobile communications devices. After receiving a wake-up signal triggered by a movement or change in position on the part of the remote key fob, the communications and control device can activate the detection coil for monitoring the control surface with the specific detection sections for a defined period of time, for example, 30 minutes or 10 minutes. However, if a remote key fob is disposed in a storage position, unused and not moved, the detection coil is deactivated after the defined period of time has elapsed.

In one alternative design, the wake-up device is embodied with a capacitive sensor that detects a user's approach or access to the remote key fob and, as a function thereof, outputs a signal to the communications and control device. In this design, as well, activation of the detection coil is accomplished as a function of a usage action being detected. A capacitive sensor may also detect approaches in a contactless manner, however—that is, there does not necessarily have to be a change in the position of, or an acceleration of, the remote key fob for the detection coil for monitoring the control surface to be activated.

In one preferred design of the invention, the remote key fob is embodied with no gaps and integrally with the surrounding housing in the region of the control surface. Thus, the outer top side of the control surface is protected against the penetration of dirt and liquids, with no gaps, and is also especially easy to clean. In the interior of the housing, the housing may be embodied entirely differently in the region of the control surface—for instance, an intentional weakening in the housing may be provided for easier deformation of the control surface using external pressure.

In one preferred embodiment of the invention, the detection section is formed by metal coating of the control surface.

Such a metal coating may in principle be applied in the outer region, that is, to the outer shell of the housing, but also in the inner region of the housing, for example by applying a metal finish or a metal film beneath the control surface.

BRIEF DESCRIPTION OF THE DRAWINGS

The invention shall now be explained in greater detail using the enclosed drawings.

DETAILED DESCRIPTION

Figure 1:
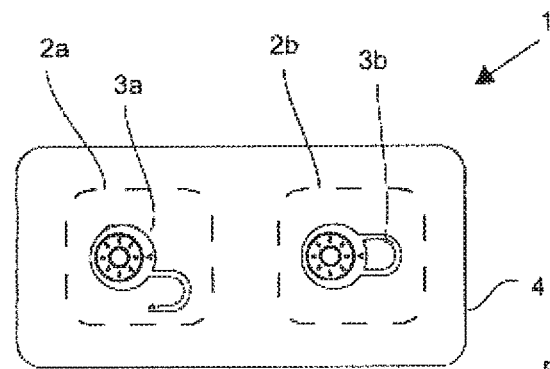
FIG. 1 is a schematic depiction of a remote key fob according to a first embodiment of the invention.

FIG. 1 depicts a remote key fob 1 that has two control surfaces 2a and 2b. In this example, the control surfaces 2a and 2b are provided with symbols that are linked to the associated functions for locking and unlocking a vehicle. The top side of the key fob, visible in FIG. 1, is made of a transparent plastic in which metal detection sections 3a and 3b are embedded which are metal inlays shaped as lock symbols. The surface of the remote key fob 1 in the region of the control surfaces is embodied with no contour and with no gaps; it is a smooth surface that is continuous in the outward direction. The regions identified with broken lines indicate control surfaces 2a and 2b that are mechanically weakened on the inside of the housing, wherein the housing wall is embodied thinner in these regions.

Figure 2:
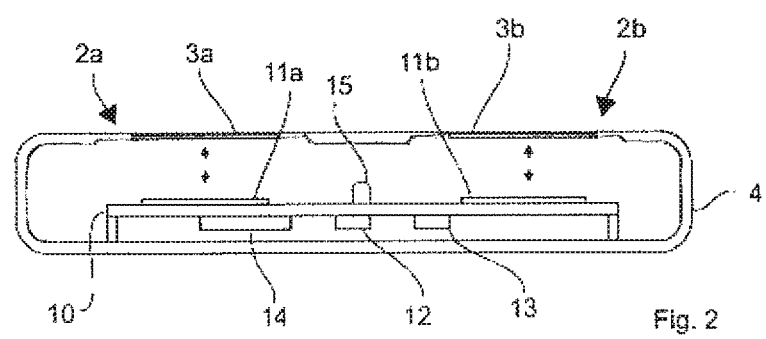
FIG. 2 is a schematic depiction of a section through the remote key fob from FIG. 1.

FIG. 2 is a schematic depiction of a section through the remote key fob from FIG. 1. The housing 4 is embodied with a reduced wall thickness in the control surfaces 2a and 2b. In addition, metal detection sections 3a and 3b are embedded and arranged in the transparent housing material of the housing 4. The printed circuit board 10, which is attached to the back of the housing 4, is disposed beneath the control surfaces 2a, 2b and the metal detection sections 3a, 3b embedded therein in the form of lock symbols. Arranged on the printed circuit board 10 are two detection coils 11a, 11b that are disposed vertically beneath the control surfaces 2a, 2b and the metal detection sections 3a, 3b. The detection coils 11a, 11b are connected to the communications and control circuit 12 via lines on the printed circuit board. Likewise, a motion switch 13 is arranged on the back of the printed circuit board and coupled to the communications and control circuit 12, as are an energy cell 14 in the form of a battery and an LED 15 for backlighting the transparent top side of the housing 4.

In FIG. 2, arrows indicate that a pressure actuation of the mechanically weakened control surfaces 2a or 2b results in a change in position of the metal detection sections 3a or 3b, changing the inductivity of the coil 11a or 11b or its quality. This is detected using a corresponding circuit in the communications and control circuit 12. The detection coils 11a, 11b are activated via the communications and control circuit 12 as a function of a signal from the motion sensor 13. If the key fob 1 is moved, the LED 15 is activated and the coil inductivities or coil quality of the detection coils 11a and 11b are detected. Then the transparent regions that surround the metal detection sections 3a, 3b in the region of the control surfaces 2a, 2b are illuminated and this signals readiness to execute actuation detection using pressure actuation of these regions.

Figure 3:
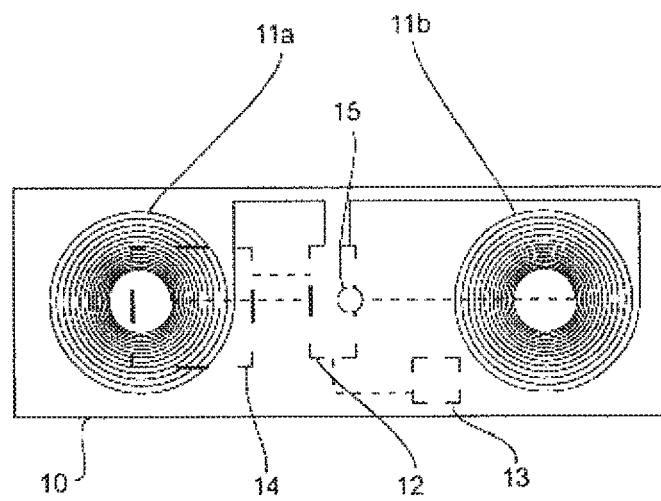
FIG. 3 is a schematic depiction of essential components on the printed circuit board that is arranged in the remote key fob.

FIG. 3 is a top view of the printed circuit board 10 and the arrangement of the detection coils 11a and 11b on the printed circuit board. In addition, the LED 15 is arranged on the same side of the printed circuit board 10 in the region between the detection coils, so that it can illuminate both control surfaces 2*a* and 2*b*. The motion sensor 13 is arranged on the back of the printed circuit board and is coupled to the communications and control circuit 12. A battery cell 14 supplies the communications and control circuit 12 with energy.

Other components may also be provided, in particular communications components for high-frequency communications outside of the communications and control circuit 12, but these are not illustrated in this depiction because they are not essential for the invention.

The invention claimed is:

1. A remote key fob for a vehicle, comprising
a communications and control device that includes at least one transmit/receive device,
a microcontroller,
a housing, arranged on the outer shell of which is a control surface that is coupled to the communications and control device for detecting operations of the control surface,
a printed circuit board accommodated in the housing and placed beneath the control surface and on which the microcontroller is placed,
wherein the control surface is mechanically coupled to a metal detection section such that a pressure actuation of the control surface from the outside results in a deformation or change of position of the metal detection section,
wherein the printed circuit board located beneath the control surface and the metal detection section includes a detection coil, wherein the detection coil is coupled to the communications and control device for forming an inductive proximity switch,
wherein the communications and control device determines a measure for the inductivity or quality of the detection coil and detects an actuation of the control surface as a function of the measure for the inductivity or quality of the detection coil.

2. The remote key fob according to claim 1, wherein the detection coil is printed on the printed circuit board as a spiral conductor.

3. The remote key fob according to claim 1, wherein the communications and control device activates and deactivates the detection coil,
wherein a wake-up device is coupled to the communications and control device, and
wherein the communications and control device intermittently activates the detection coil as a function of a signal from the wake-up device.

4. The remote key fob according to claim 3, wherein the wake-up device includes a motion sensor that detects changes in position or accelerations of the remote key fob and outputs a signal to the communications and control device as a function thereof.

5. The remote key fob according to claim 3, wherein the wake-up device includes a capacitive sensor that detects a user's approach or access to the remote key fob and, as a function thereof, outputs a signal to the communications and control device.

6. The remote key fob according to claim 1, wherein the control surface is embodied with no gaps and integrally with the housing adjacent to the control surface.

7. The remote key fob according to claim 1, wherein the control surface is transparent, at least in part, and is back-lit, at least in part.

8. The remote key fob according to claim 1, wherein the detection section is formed by a metal coating of the control surface.

* * * * *